(12) United States Patent
Sano

(10) Patent No.: US 12,267,951 B2
(45) Date of Patent: Apr. 1, 2025

(54) ELECTRONIC DEVICE

(71) Applicant: Japan Display Inc., Tokyo (JP)

(72) Inventor: Takumi Sano, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 307 days.

(21) Appl. No.: 17/950,124

(22) Filed: Sep. 22, 2022

(65) Prior Publication Data

US 2023/0019276 A1 Jan. 19, 2023

Related U.S. Application Data

(63) Continuation of application No. PCT/JP2021/000876, filed on Jan. 13, 2021.

(30) Foreign Application Priority Data

Mar. 23, 2020 (JP) .................. 2020-051111

(51) Int. Cl.
H05K 1/02 (2006.01)
(52) U.S. Cl.
CPC .................. H05K 1/0283 (2013.01)
(58) Field of Classification Search
CPC .................................................. H05K 1/0283
USPC ........................................................ 361/749
See application file for complete search history.

(56) References Cited

U.S. PATENT DOCUMENTS

| | | |
|---|---|---|
| 2015/0282294 A1 | 10/2015 | Wakuda et al. |
| 2015/0282296 A1 | 10/2015 | Ogura et al. |
| 2016/0104850 A1* | 4/2016 | Joo .......... B32B 3/266 |
| | | 428/116 |
| 2017/0181276 A1 | 6/2017 | Sawada et al. |
| 2018/0114491 A1 | 4/2018 | Tokuda |
| 2020/0168824 A1* | 5/2020 | Park .............. H05K 1/0283 |
| 2021/0013431 A1 | 1/2021 | Kawata et al. |

FOREIGN PATENT DOCUMENTS

| | | |
|---|---|---|
| JP | 2015-198101 A | 11/2015 |
| JP | 2015-198102 A | 11/2015 |
| JP | 2017-113088 A | 6/2017 |
| JP | 2017-118109 A | 6/2017 |
| JP | 2018-66933 A | 4/2018 |
| WO | 2019/187568 A1 | 10/2019 |

OTHER PUBLICATIONS

English translation of a Japanese Office action mailed on May 7, 202, in corresponding Japanese Patent Application No. 2020-051111, 4pp.
International Search Report and Written Opinion mailed on Apr. 13, 2021, received for PCT Application PCT/JP2021/000876, filed on Jan. 13, 2021, 9 pages including English Translation.

* cited by examiner

*Primary Examiner* — Binh B Tran
(74) *Attorney, Agent, or Firm* — XSENSUS LLP

(57) ABSTRACT

According to one embodiment, an electronic device includes an insulating base including a first portion which is stretchable and a second portion which is adjacent to the first portion and is stretchable, the first portion and the second portion being integrally formed, and electrical elements disposed in the first portion and the second portion, respectively. A first elongation rate of the first portion is different from a second elongation rate of the second portion.

9 Claims, 14 Drawing Sheets

ELECTRONIC DEVICE

CROSS-REFERENCE TO RELATED APPLICATIONS

This application is a Continuation Application of PCT Application No. PCT/JP2021/000876, filed Jan. 13, 2021 and based upon and claiming the benefit of priority from Japanese Patent Application No. 2020-051111, filed Mar. 23, 2020, the entire contents of all of which are incorporated herein by reference.

FIELD

Embodiments described herein relate generally to an electronic device.

BACKGROUND

In recent years, the use of flexible substrates having flexibility and elasticity has been studied in various fields. For example, it is conceivable that a flexible substrate with electrical elements arrayed in a matrix is used in the state of being attached to a curved surface, such as the housing of an electronic device or the human body. For example, various sensors such as touch sensors and temperature sensors and display elements can be applied as the electrical elements.

In a flexible substrate, measures must be taken to prevent wiring lines from being damaged by stress due to bending or stretching. As the measures, there has been a proposal to, for example, provide a honeycombed opening in a base substrate supporting the wiring lines or form the wiring lines into a meandering shape.

DETAILED DESCRIPTION

Figure 1:
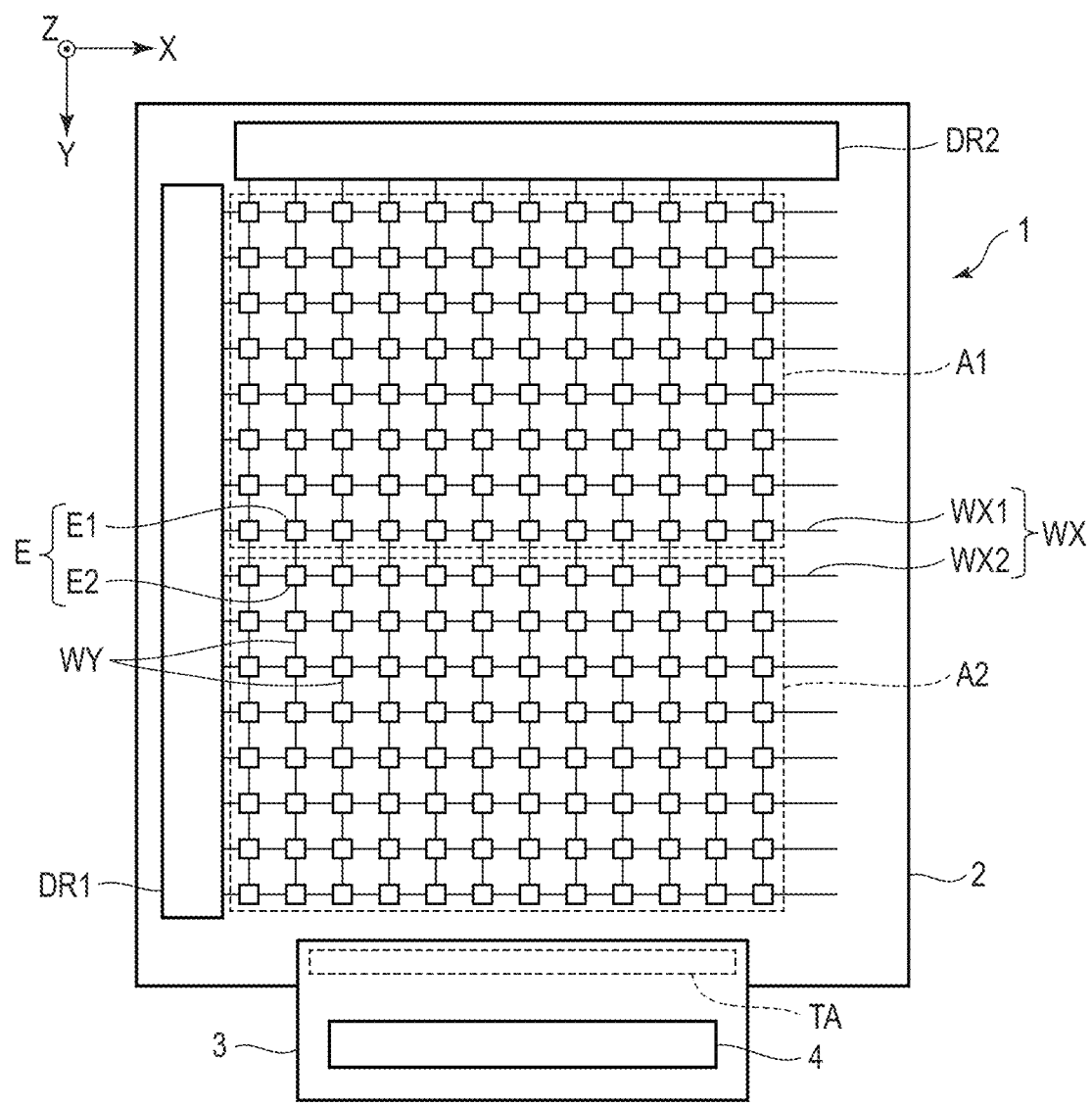
FIG. 1 is a schematic plan view of an electronic device 1 according to an embodiment.

In general, according to one embodiment, an electronic device includes an insulating base including a first portion which is stretchable and a second portion which is adjacent to the first portion and is stretchable, the first portion and the second portion being integrally formed, and electrical elements disposed in the first portion and the second portion, respectively. A first elongation rate of the first portion is different from a second elongation rate of the second portion.

According to another embodiment, an electronic device includes an insulating base including a first portion which is stretchable and a second portion which is adjacent to the first portion and is stretchable, the first portion and the second portion being integrally formed, and electrical elements disposed in the first portion and the second portion, respectively. The insulating base includes a first strip portion located between adjacent first opening portions in the first portion and a second strip portion located between adjacent second opening portions in the second portion. The shape of the first strip portion is different from the shape of the second strip portion.

According to another embodiment, an electronic device includes an insulating base including a first portion which is stretchable, a second portion which is stretchable, and a third portion which is located between the first portion and the second portion and is stretchable, the first portion, the second portion, and the third portion being integrally formed, and electrical elements disposed in the first portion, the second portion, and the third portion, respectively. A first elongation rate of the first portion, a second elongation rate of the second portion, and a third elongation rate of the third portion are different from each other. A difference between the second elongation rate and the third elongation rate is different from a difference between the first elongation rate and the second elongation rate.

According to the embodiments, an electronic device configured to have partially different elasticity can be provided.

A present embodiment will be described hereinafter with reference to the drawings. The disclosure is merely an example, and proper changes within the spirit of the invention which are easily conceivable by a person having ordinary skill in the art are included in the scope of the present invention as a matter of course. In addition, in order to make the description clearer, the width, thickness, shape, etc., of each portion may be schematically illustrated in the drawings, compared those in the actual modes, but they are mere examples and do not limit the interpretation of the present invention. In the specification and drawings, the structural elements that have the same or similar functions as or to those described in connection with preceding drawings are denoted by the same reference symbols, and a detailed description thereof may be omitted as appropriate.

FIG. 1 is a schematic plan view of an electronic device 1 according to the present embodiment. In the present embodiment, a first direction X, a second direction Y, and a third direction Z are defined as shown in the figure. The first direction X, the second direction Y, and the third direction Z are orthogonal to each other but may cross at an angle other than 90°. The first direction X and the second direction Y correspond to, for example, directions parallel to a main surface of the electronic device 1, and the third direction Z corresponds to a thickness direction of the electronic device 1.

The electronic device 1 comprises a flexible substrate 2, a circuit board 3, and a controller 4. The circuit board 3 is, for example, a flexible printed circuit board, and is electrically connected to each terminal in a terminal area TA of the flexible substrate 2. The controller 4 is mounted on the circuit board 3 but may be mounted on the flexible substrate 2.

The flexible substrate 2 as a whole is configured to have flexibility and elasticity. The flexible substrate 2 comprises a first area A1 and a second area A2 adjacent to the first area A1. The first area A1 and the second area A2 are areas different from each other in elasticity. A specific example for achieving the structure in which the first area A1 and the second area A2 are different in elasticity will be described later.

In the example shown in FIG. 1, the first area A1 and the second area A2 are arranged in the second direction Y. However, the first area A1 and the second area A2 may be arranged in the first direction X, or the second area A2 may surround the first area A1. The arrangement of these areas is not limited to the example shown in the figure. In addition, the flexible substrate 2 may comprise three or more areas which are different from each other in elasticity.

The flexible substrate 2 comprises a first driver DR1, a second driver DR2, X lines WX, Y lines WY, electrical elements E, etc.

The first driver DR1 and the second driver DR2 are, for example, disposed on the flexible substrate 2, but may be disposed on the circuit board 3, the controller 4, or another substrate. "X lines WX" is a generic name for wiring lines extending substantially in the first direction X, and at least some of the X lines WX are electrically connected to the first driver DR1. The X lines WX are arranged in the second direction Y. "Y lines WY" is a generic name for wiring lines extending substantially in the second direction Y, and at least some of the Y lines WY are electrically connected to the second driver DR2. The Y lines WY are arranged in the first direction X. The X lines WX and the Y lines WY include a plurality of types of wiring line, such as scanning lines, signal lines, power lines, and various control lines.

The X lines WX include X lines WX1 disposed in the first area A1 and the X lines WX2 disposed in the second area A2. The Y lines WY are disposed to extend over the first area A1 and the second area A2.

The electrical elements E include electrical elements E1 disposed in the first area A1 and electrical elements E2 disposed in the second area A2. In the first area A1, the electrical elements E1 are arrayed in a matrix in the first direction X and the second direction Y and electrically connected to the X lines WX1 and the Y lines WY. In the second area A2, the electrical elements E2 are arrayed in a matrix in the first direction X and the second direction Y and electrically connected to the X lines WX2 and the Y lines WY.

The electrical elements E are, for example, sensors, semiconductor elements, or actuators. For example, optical sensors which receive visible light or near-infrared light, temperature sensors, pressure sensors, or touch sensors can be applied as the sensors. For example, light-emitting elements, photoreceivers, diodes, or transistors can be applied as the semiconductor elements. The electrical elements E are not limited to those described herein, and other elements having various functions can be applied. In addition, the electrical elements E may be capacitors, resistors, or the like.

The electrical elements E1 may be elements having functions equal to those of the electrical elements E2 or may be elements having functions different from those of the electrical elements E2. For example, the electrical elements E1 and E2 may both be light-emitting elements or may both be sensors. In addition, the electrical elements E1 and E2 may be light-emitting elements and sensors, respectively.

If the electrical elements E are light-emitting elements, flexible display having flexibility and elasticity can be achieved. The light-emitting elements may be, for example, micro light-emitting diodes (micro-LEDs) with the longest side shorter than or equal to 100 μm, or may be mini-LEDs with the longest side longer than 100 μm but shorter than 300 μm, or may be LEDs with the longest side longer than or equal to 300 μm. In addition, the light-emitting elements may be other self-luminous elements, such as organic electroluminescent elements.

The flexible substrate 2 comprises an insulating base 10, which will be described later. For example, the first driver DR1, the second driver DR2, the X lines WX, the Y lines WY, and the electrical elements E are all disposed on the insulating base 10.

Figure 2:
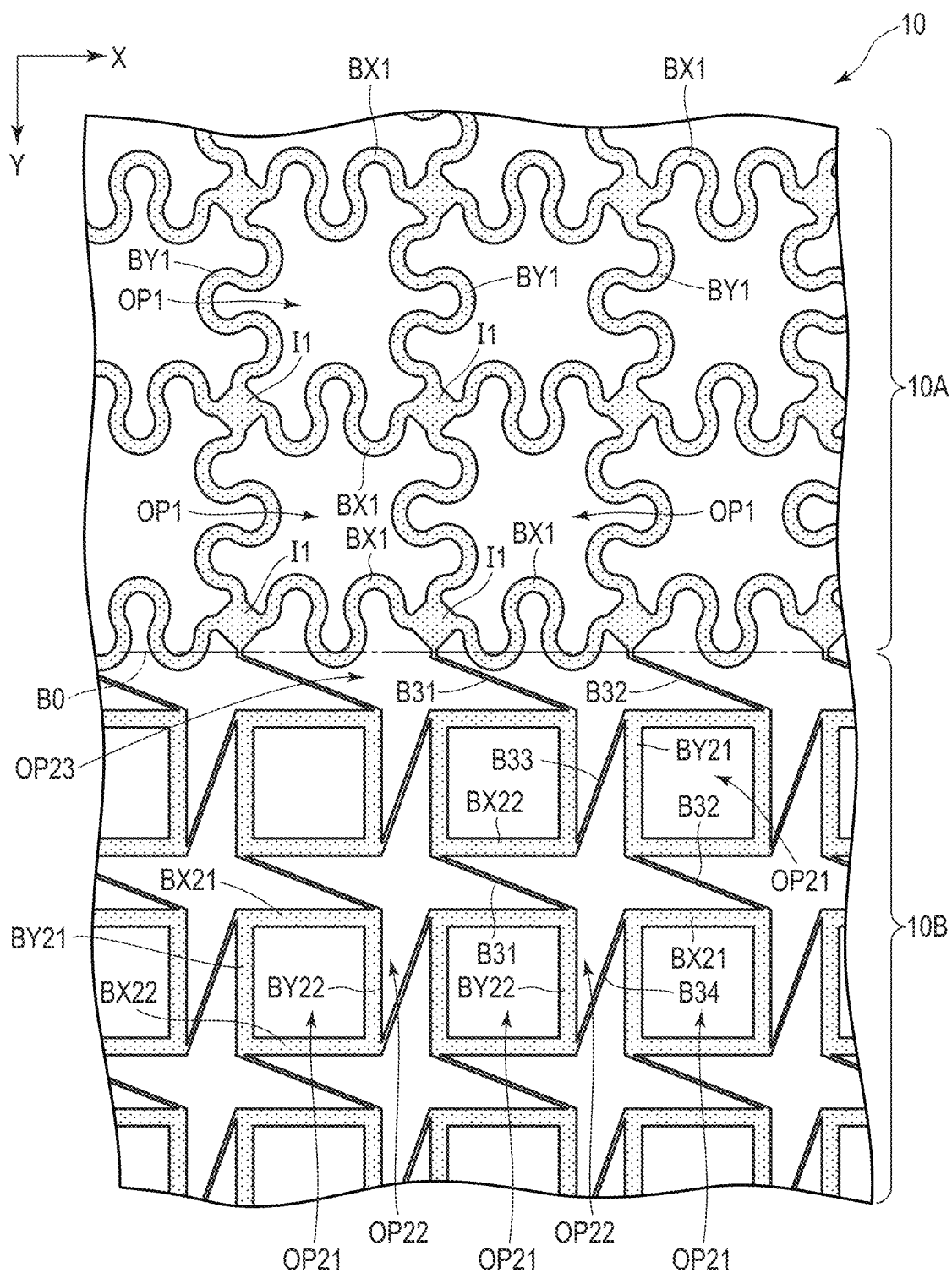
FIG. 2 is a schematic plan view of an insulating base 10 constituting a flexible substrate 2.

FIG. 2 is a schematic plan view of the insulating base 10 constituting the flexible substrate 2. The insulating base 10 comprises a first portion 10A which is stretchable and a second portion 10B which is adjacent to the first portion 10A and which is stretchable. The first portion 10A and the second portion 10B are integrally formed. Being stretchable herein means the property of being able to expand and contract, that is, the property of being able to expand from an unexpanded state, which is a normal state, and being able to be restored when released from an expanded state. The unexpanded state is a state where no tensile stress is applied.

In addition, the elongation rate of the first portion 10A is different from that of the second portion 10B. For example, the elongation rate of the first portion 10A is higher than that of the second portion 10B. The elongation rates herein mean values obtained by carrying out a tensile test. In the tensile test, a specimen comprising a wiring line is prepared, and is pulled until the wiring line is broken. Then, a value obtained by dividing an increment in the length (L1−L0) by L0 is calculated as an elongation rate, where L0 is the length of the specimen in a state where no tensile stress is applied, and L1 is the length of the specimen in a state where tensile stress is applied and the specimen is thereby elongated. That is, the elongation rate is given by (L1−L0)/L0. For example, an elongation rate of 50% corresponds to being able to be elastically deformed to the length L1, which is 1.5 times greater than the length L0, when tensile stress is applied. For example, the first portion 10A and the second portion 10B both have an elongation rate of 20% or more.

The first portion 10A is formed to correspond to the first area A1 shown in FIG. 1, and the second portion 10B is formed to correspond to the second area A2 shown in FIG. 1. The first portion 10A and the second portion 10B are formed, for example, into a mesh shape. In the following description, the first portion 10A and the second portion 10B will be explained more specifically.

The first portion 10A comprises strip portions BX1 formed substantially along the first direction X, strip portions BY1 formed substantially along the second direction Y, and island-like portions I1. The strip portions BX1 are arranged in the second direction Y, and the strip portions BY1 are arranged in the first direction X. Each of the strip portions BX1 and BY1 is stretchable. For example, the strip portions BX1 and BY1 meander. The island-like portions I1 correspond to the intersections of the strip portions BX1 and the strip portions BY1.

The island-like portions I1 are arrayed in a matrix in the first direction X and the second direction Y. The island-like portions I1 adjacent to each other in the first direction X are connected by the strip portions BX1, and the island-like portions I1 adjacent to each other in the second direction Y are connected by the strip portions BY1. The shapes of the island-like portions I1 may be quadrangles such as a square, a rectangle, or a rhombus, other polygons, or other shapes such as a circle or an ellipse. The strip portions BX1 and BY1 may be connected to the corner portions of the island-like portions I1 or may be connected to the sides of the island-like portions I1.

In other words, the first portion 10A comprises opening portions OP1 penetrating the insulating base 10. The opening portions OP1 are arrayed in a matrix. Each of the opening portions OP1 is surrounded by two strip portions BX1 adjacent to each other in the second direction Y and two strip portions BY1 adjacent to each other in the first direction X. That is, each of the strip portions BY1 is located between two opening portions OP1 adjacent to each other in the first direction X, and each of the strip portions BX1 is located between two opening portions OP1 adjacent to each other in the second direction Y.

The respective shapes of the opening portions OP1 are substantially identical. However, in the example shown in FIG. 2, of the opening portions OP1 adjacent to each other in the first direction X or the second direction Y, the shape of one opening portion OP1 is substantially equal to a shape obtained by rotating the shape of the other opening portion OP1 at 90° in an X-Y plane.

The second portion 10B comprises strip portions BX21 and BX22 formed along the first direction X, strip portions BY21 and BY22 formed along the second direction Y, and strip portions B31 to B34 formed along other directions. The strip portions BX21 and BX22, the strip portions BY21 and BY22, and the strip portions B31 to B34 are formed straight. The shapes of the strip portions (first strip portions) BX1 and BY1 of the first portion 10A are different from all the shapes of the strip portions (second strip portions) BX21 and BX22, the strip portions BY21 and BY22, and the strip portions B31 to B34 of the second portion 10B.

In other words, the second portion 10B comprises opening portions OP21 and opening portions OP22. These opening portions OP21 and OP22 all penetrate the insulating base 10. The opening portions OP21 and OP22 are all formed into a polygonal shape, but the shapes of the opening portions OP21 are different from the shapes of the opening portions OP22. In addition, the shapes of the opening portions (first opening portions) OP1 of the first portion 10A are different from both the shapes of the opening portions (second opening portions) OP21 and the opening portions OP22 of the second portion 10B.

The opening portions OP21 are, for example, each formed into a quadrangle surrounded by the strip portions BX21 and BX22 adjacent to each other in the second direction Y and the strip portions BY21 and BY22 adjacent to each other in the first direction X. The opening portions OP21 are arrayed in a matrix. The strip portion B33 or the strip portion B34 is located between the opening portions OP21 adjacent to each other in the first direction X. In addition, the strip portion B31 or the strip portion B32 is located between the opening portions OP21 adjacent to each other in the second direction Y.

The opening portions OP22 are, for example, each formed into a star-shaped octagon surrounded by the strip portions B31 and B32 adjacent to each other in the first direction X, the strip portions B33 and B34 adjacent to each other in the second direction Y, the strip portion BX22 connecting the strip portions B31 and B33, the strip portion BY21 connecting the strip portions B32 and B33, the strip portion BX21 connecting the strip portions B32 and B34, and the strip portion BY22 connecting the strip portions B31 and B34. The opening portions OP22 are arrayed in a matrix. The strip portion B31 or the strip portion B32 is located between the opening portions OP22 adjacent to each other in the first direction X. In addition, the strip portion B33 or the strip portion B34 is located between the opening portions OP22 adjacent to each other in the second direction Y.

The shapes of the opening portions OP21 and the opening portions OP22 are not limited to the example shown in FIG. 2, and various shapes can be adopted.

For example, an island-like portion I1 of the first portion 10A and a strip portion B31 or B32 of the second portion 10B are connected at a border B0 between the first portion 10A and the second portion 10B. Any one of the strip portions in the first portion 10A may be connected to any one of the strip portions in the second portion 10B. In this manner, the border B0 at which an element of the first portion 10A and an element of the second portion 10B are connected is a point of change of elongation rate.

In addition, the area including the border B0 comprises opening portions OP23 arranged in the first direction X. The opening portions OP23 are surrounded by the strip portions BX1 and the strip portions B31 to B33. The shapes of the opening portions OP23 are different from all the shapes of the opening portions OP1, the opening portions OP21, and the opening portions OP22.

The insulating base 10 comprising the first portion 10A and the second portion 10B, which comprise the opening portions of different shapes, the strip portions of different shapes, or different elongation rates as described above, is formed of, for example, polyimide. In this case, the first portion 10A and the second portion 10B are integrally formed by patterning a polyimide film. The material of the insulating base 10 is not limited to polyimide, and other resin materials also can be used.

Figure 3:
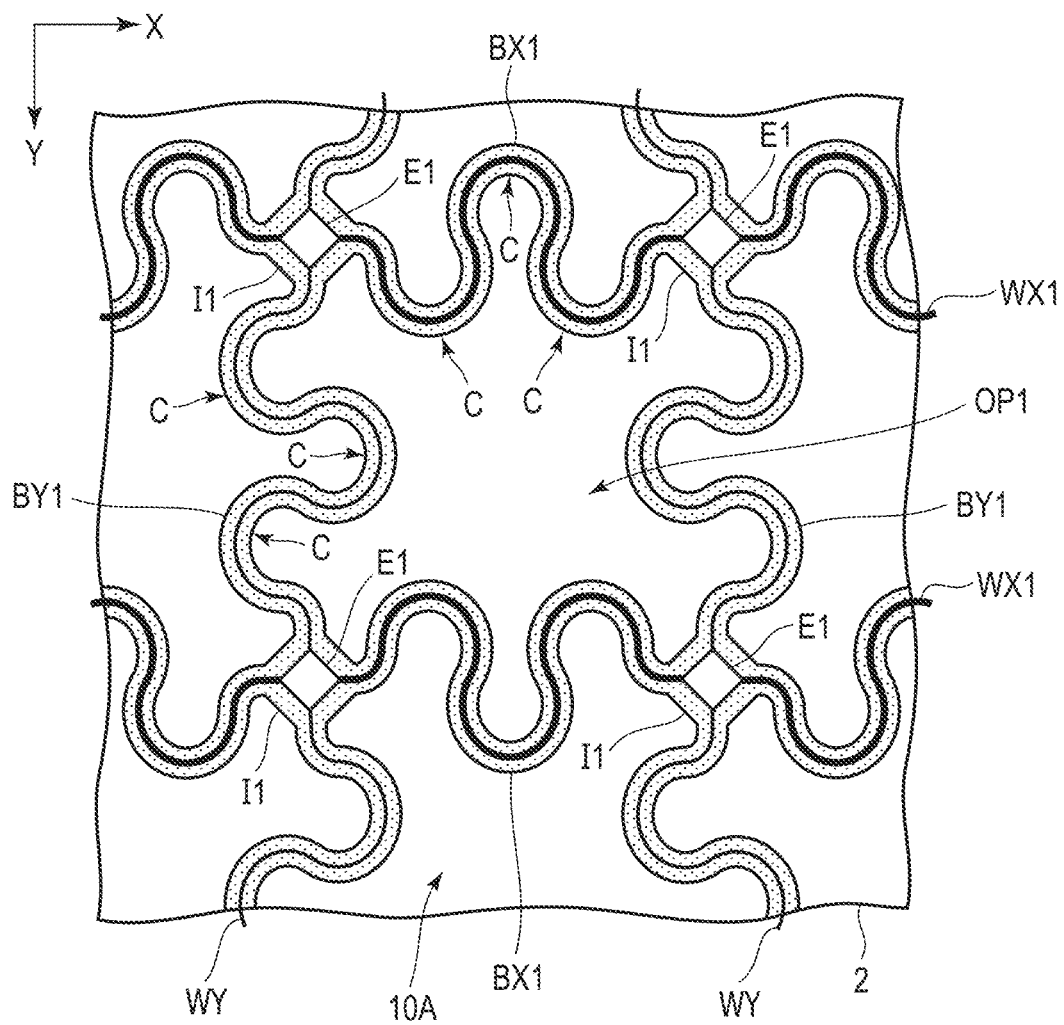
FIG. 3 is an enlarged plan view of a first portion 10A of the insulating base 10.

FIG. 3 is an enlarged plan view of the first portion 10A of the insulating base 10. The strip portions BX1 and BY1 each comprise one or more curved portions C. In the example shown in FIG. 3, the strip portions BX1 and BY1 each comprise a plurality of curved portions C and curve widely three times. Such a shape may be referred to as a meander pattern. However, the shapes of the strip portions BX1 and BY1 are not limited to the example of FIG. 3. For example, various shapes such a shape with one curve, a shape with two curves, or a shape with four or more curves can be applied. The shapes of the strip portions BX1 and BY1 may be different from each other.

The X lines WX1 are disposed on the strip portions BX1, and meander in the same way as the strip portions BX1. The Y lines WY are disposed on the strip portions BY1, and meander in the same way as the strip portions BY1. The electrical element E1 is disposed on the island-like portion I1 and is electrically connected to the X line WX1 and the Y line WY. For example, one electrical element E1 is disposed for each island-like portion I1. Alternatively, one or more electrical elements E1 of a minimum unit (for example, a pixel unit in a display device) are disposed for each island-like portion I1.

In this manner, the first portion 10A of the insulating base 10 is constituted of the island-like portions I1 and the strip portions BX1 and BY1 connecting the island-like portions I1, so that the first portion 10A can have elasticity. That is, when tensile stress or compressive stress in a specific direction is applied to the first portion 10A, the strip portions BX1 and BY1 expand or contract in accordance with the tensile stress or compressive stress. The first portion 10A is thereby deformed into a shape according to the tensile stress or compressive stress.

Figure 4:
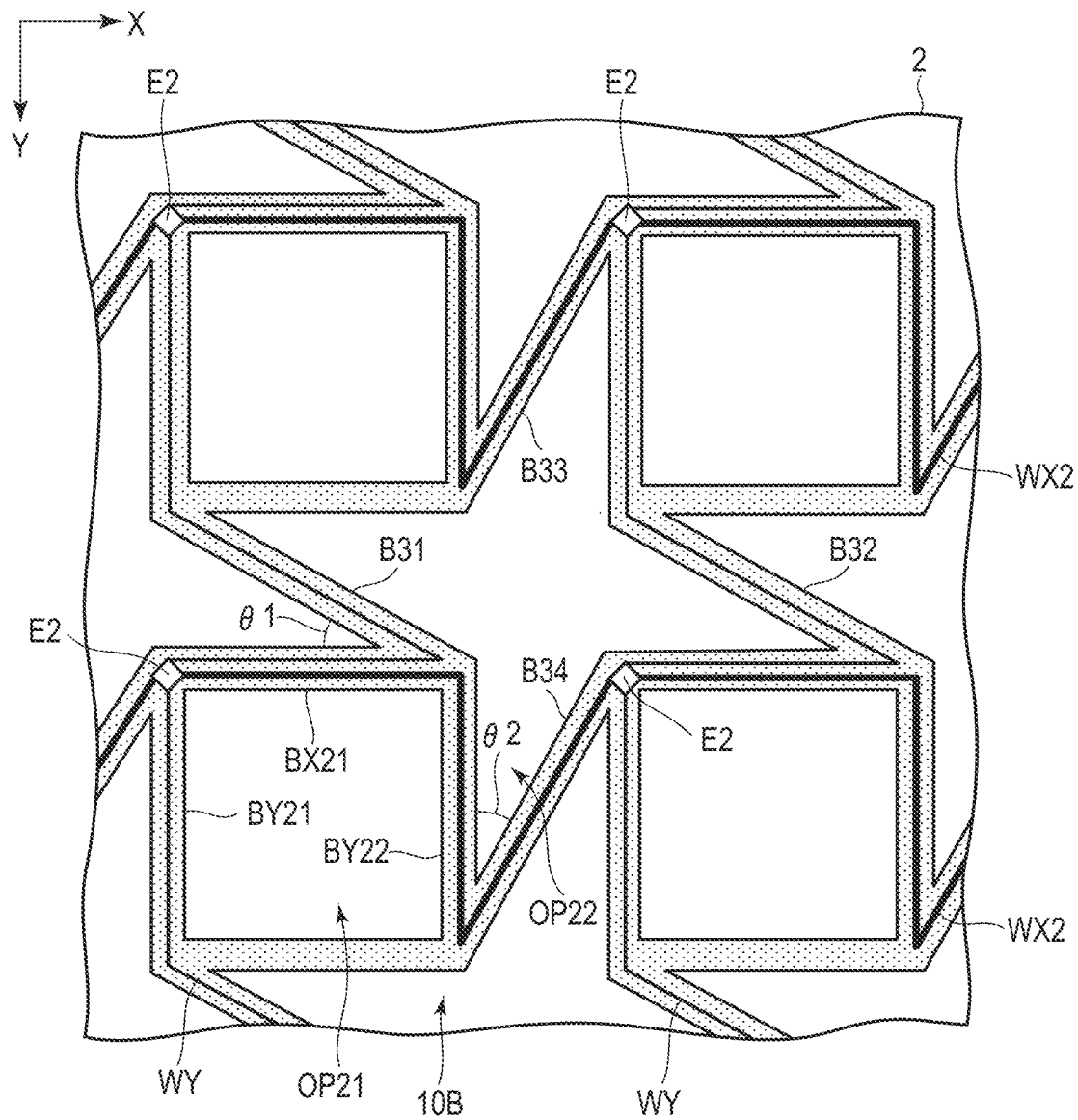
FIG. 4 is an enlarged plan view of a second portion 10B of the insulating base 10.

FIG. 4 is an enlarged plan view of the second portion 10B of the insulating base 10.

The X lines WX2 are disposed on the strip portions BX21, the strip portions BY22, and the strip portion B34. The shapes of the X lines (second lines) WX2 are different from the shapes of the X lines (first lines) WX1. The Y lines WY are disposed on the strip portion B31, the strip portions BX21, and the strip portions BY21. As described above, the Y lines WY are disposed to extend over the first portion 10A and the second portion 10B. The shapes of the Y lines (third lines) WY in the first portion 10A are different from the shapes of the Y lines WY in the second portion 10B. The electrical element E2 is disposed at the intersection of the strip portions BX21 and the strip portions BY21 and is electrically connected to the X line WX2 and the Y line WY.

In this manner, the second portion 10B of the insulating base 10 is constituted of the strip portions BX21 and BX22, the strip portions BY21 and BY22, and the strip portions B31 to B34, so that the second portion 10B can have elasticity. For example, when tensile stress or compressive stress in the second direction Y is applied to the second portion 10B, an angle θ1 formed by the strip portions B31 (or B32) and the strip portions BX21 changes in accordance with the tensile stress or compressive stress. In addition, when tensile stress or compressive stress in the first direction X is applied to the second portion 10B, an angle θ2 formed by the strip portions B34 (or B33) and the strip portions BY22 changes in accordance with the tensile stress or compressive stress. The second portion 10B is thereby deformed into a shape according to the tensile stress or compressive stress.

As described above, the electronic device 1 of the present embodiment is formed, using the insulating base 10 comprising the first portion 10A and the second portion 10B, which comprise the opening portions of different shapes, the strip portions of different shapes, or different elongation rates. Thus, the electronic device 1 configured to have partially different elasticity can be provided.

Further, the first portion 10A and the second portion 10B having different elongation rates are connected. In a case where the elongation rate of the first portion 10A is greater than that of the second portion 10B, when tensile stress is applied to the insulating base 10 in a predetermined direction, especially in a direction in which the first portion 10A and the second portion 10B are arranged, the second portion 10B reaches the limit of elongation and is broken at the border B0 between the first portion 10A and the second portion 10B. It thereby can be reported that excessive tensile stress is applied to the insulating base 10.

In addition, in a state where the electronic device 1 is attached to an object, when the object inflates excessively or the object cleaves, tensile stress is applied to the insulating base 10 in accordance with the deformation of the object, and the insulating base 10 is broken at the border B0 between the first portion 10A and the second portion 10B. That is, the inflation or cleavage of the object can be allowed.

The greater the difference between the elongation rates of the first portion 10A and the second portion 10B is, the more likely the insulating base 10 is to break at the border B0. That is, if it is required that the electronic device 1 be broken at a desired position, the border B0 between the first portion 10A and the second portion 10B should be formed at the desired position and the difference in the elongation rates should be set great. For example, the difference in the elongation rates should preferably be 20% or more.

Figure 5:
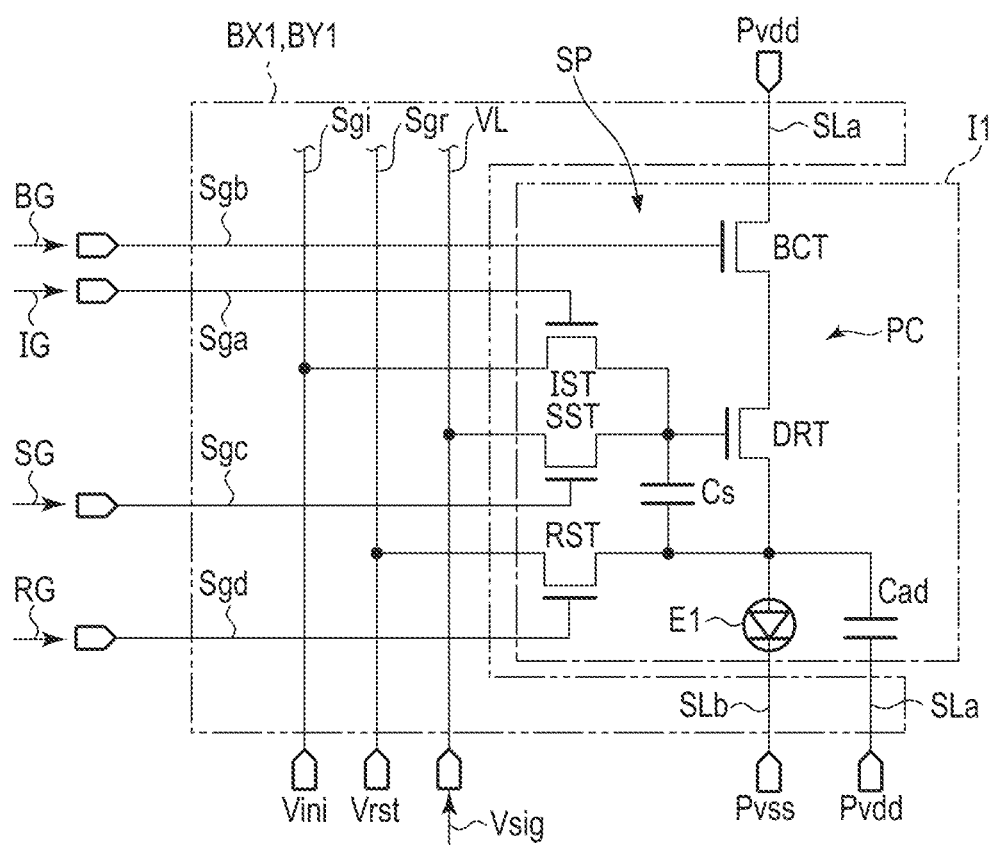
FIG. 5 is a diagram for explaining a drive circuit PC which drives an electrical element E1.

FIG. 5 is a diagram for explaining a drive circuit PC which drives the electrical element E1. An equivalent circuit shown in the figure is an example, and the drive circuit PC is not limited to this example. The description herein explains a case where the electrical elements E1 are light-emitting elements (micro-LEDs). If the electrical elements E2 are light-emitting elements equal to the electrical elements E1, the equivalent circuit shown in FIG. 5 can be applied to the drive circuits which drive the electrical elements E2.

The drive circuit PC controls the electrical element E1 in accordance with a video signal Vsig supplied to a video signal line VL. To execute such control, the drive circuit PC in the present embodiment comprises a reset switch RST, a pixel switch SST, an initialization switch IST, an output switch BCT, a drive transistor DRT, a storage capacitor Cs, and an auxiliary capacitor Cad. The auxiliary capacitor Cad is an element provided to adjust the amount of light emission current and may be unnecessary in some cases. The reset switch RST, the pixel switch SST, the initialization switch IST, the output switch BCT, and the drive transistor DRT are constituted of thin-film transistors (TFTs). The configurations of these thin-film transistors are not particularly limited.

The drive transistor DRT and the output switch BCT are connected in series to the electrical element E1 at positions between a power line SLa and a power line SLb. A drain electrode of the output switch ROT is connected to the power line SLa. A source electrode of the output switch BCT is connected to a drain electrode of the drive transistor DRT. A gate electrode of the output switch BCT is connected to a scanning line Sgb. The output switch BCT is thereby turned on or off by a control signal BG supplied to the scanning line Sgb. Here, to be on is to be in a conductive state, and to be off is to be in a non-conductive state. The output switch BCT controls the light emission time of the electrical element E1 on the basis of the control signal BG. A source electrode of the drive transistor DRT is connected to one electrode (in this example, an anode) of the electrical element E1. The other electrode (in this example, a cathode) of the electrical element E1 is connected to the power line SLb. The drive transistor DRT outputs a driving current according to the video signal Vsig to the electrical element E1.

A source electrode of the pixel switch SST is connected to the video signal line VL. A drain electrode of the pixel switch SST is connected to a gate electrode of the drive transistor DRT. A gate electrode of the pixel switch SST is connected to a scanning line Sgc functioning as a gate line for signal write control. The pixel switch SST is turned on or off by a control signal SG supplied from the scanning line Sgc, and switches connection and disconnection of the drive circuit PC and the video signal line VL. That is, when the pixel switch SST is turned on, the video signal Vsig of the video signal line VL is taken into the drive circuit PC.

A source electrode of the initialization switch IST is connected to an initialization line Sgi. A drain electrode of the initialization switch IST is connected to the gate electrode of the drive transistor DRT. A gate electrode of the initialization switch IST is connected to a scanning line Sga. The initialization switch IST is turned on or off by a control signal IG supplied from the scanning line Sga, and switches connection and disconnection of the drive circuit PC and the initialization line Sgi. That is, when the initialization switch IST is turned on, an initialization potential Vini of the initialization line Sgi is taken into the drive circuit PC.

A source electrode of the reset switch RST is connected to a reset line Sgr. A gate electrode of the reset switch RST is connected to a scanning line Sgd functioning as a gate line for reset control. The reset switch RST is turned on or off by a control signal RG supplied from the scanning line Sgd. When the reset switch RST is turned on, the potential of the source electrode of the drive transistor DRT can be reset to a reset potential Vrst of the reset line Sgr.

The storage capacitor Cs is connected between the gate electrode and the source electrode of the drive transistor DRT. The auxiliary capacitor Cad is connected between the source electrode of the drive transistor DRT and the power line SLa.

In the above-described configuration, the drive circuit PC is controlled by the control signals IG, BG, SG, and RG supplied to the scanning lines Sga, Sgb, Sgc, and Sgd, and the electrical element E1 emits light of luminance according to the video signal Vsig of the video signal line VL.

For example, the electrical element E1 and the drive circuit PC, surrounded by a long dashed short dashed line, is disposed on the island-like portion I1 shown in FIG. 3. In addition, each of the scanning lines Sga, Sgb, Sgc, and Sgd, the video signal line VL, the power lines SLa and SLb, the reset line Sgr, and the initialization line Sgi, surrounded by a long dashed and double-short dashed line, corresponds to any one of the X lines WX1 and the Y lines WY shown in FIG. 3, and is disposed on any one of the strip portions BX1 and the strip portions BY1 shown in FIG. 3.

Figure 6:
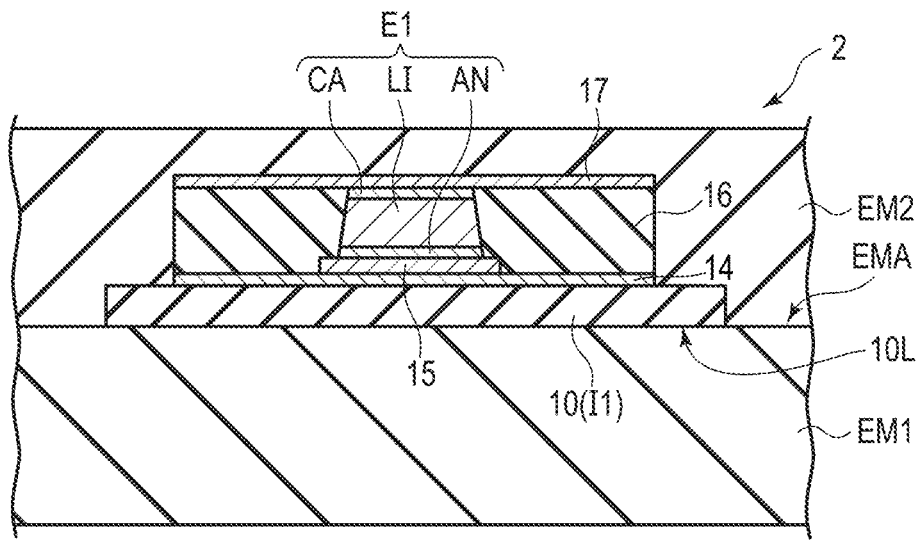
FIG. 6 is a schematic cross-sectional view of the flexible substrate 2 including an island-like portion I1.

FIG. 6 is a schematic cross-sectional view of the flexible substrate 2 including the island-like portion I1. The flexible substrate 2 comprises a first electrode 14, a connection layer 15, an insulating layer 16, and a second electrode 17 in addition to the electrical elements E1. The first electrode 14 is disposed on the island-like portion I1. The first electrode 14 is electrically connected to the power line SLa shown in FIG. 5. Another insulating layer or another conductive layer may be interposed between the first electrode 14 and the island-like portion I1. The connection layer 15 is, for example, solder, and is in contact with an upper surface of the first electrode 14. The electrical element E1 is disposed on the connection layer 15.

The electrical element E1 comprises an anode AN, a cathode CA, and a light-emitting layer LI disposed between the anode AN and the cathode CA. The anode AN is in contact with an upper surface of the connection layer 15. The insulating layer 16 covers the first electrode 14, the connection layer 15, and the electrical element E1. The cathode CA is exposed through the insulating layer 16. The second electrode 17 is disposed on the cathode CA and the insulating layer 16 and is in contact with the cathode CA. The second electrode 17 is electrically connected to the power line SLb shown in FIG. 5. The light-emitting layer LI emits light in accordance with the potential difference between the anode AN and the cathode CA.

A lower surface 10L of the insulating base 10 is in contact with an elastic member EM1. The island-like portion I1, the first electrode 14, the insulating layer 16, and the second electrode 17 are covered by an elastic member EM2. In an area where the island-like portion I1 is not provided, the elastic member EM2 is in contact with an upper surface EMA of the elastic member EM1. The elastic members EM1 and EM2 can be formed of, for example, stretchable transparent resin materials.

The cross-sectional structure shown in FIG. 6 can be applied to the cross-sectional structure including the electrical elements E2 in the second portion 10B.

Figure 7:
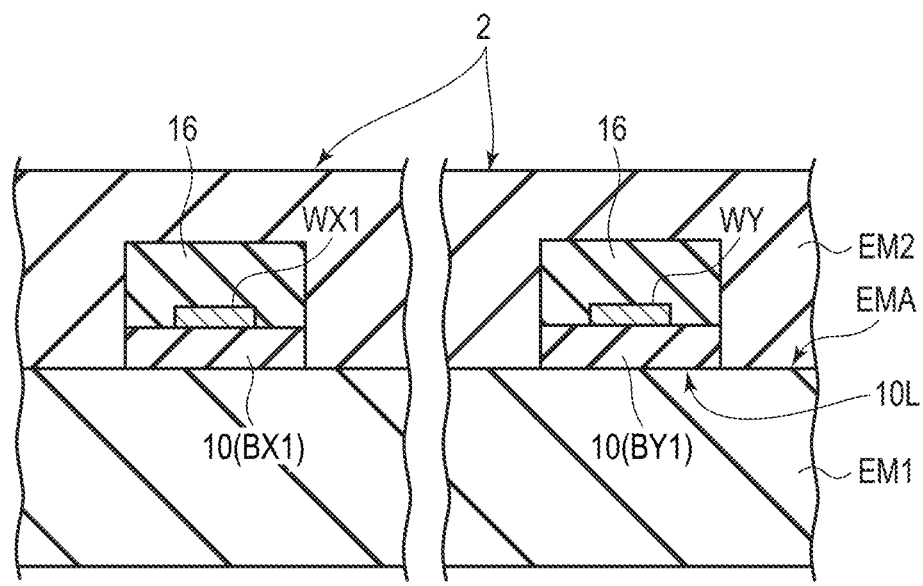
FIG. 7 is a schematic cross-sectional view of the flexible substrate 2 including strip portions BX1 and BY1.

FIG. 7 is a schematic cross-sectional view of the flexible substrate 2 including the strip portions BX1 and BY1. The X line WX1 is disposed on the strip portion BX1, and the Y line WY is disposed on the strip portion BY1. Other insulating layers may be interposed between the X line WX1 and the strip portion BX1 and between the Y line WY and the strip portion BY1, respectively. The X line WX1 and the Y line WY may be located in the same layer or may be located in different layers. The X line WX1 and the Y line WY are each covered by the insulating layer 16.

The strip portion BX1, the strip portion BY1, and the insulating layer 16 are covered by the elastic member EM2. In an area where the strip portions BX1 and BY1 are not provided, the elastic member EM2 is in contact with the upper surface EMA of the elastic member EM1.

The first electrode 14 is formed of, for example, a metallic material, but may be formed of a transparent conductive material such as indium tin oxide (ITO). The second electrode 17 is formed of a transparent conductive material such as ITO. The insulating layer 16 is formed of an organic insulating material such as photosensitive acrylic resin. The insulating layer 16 may include an inorganic insulating layer. The X line WX1 and the Y line WY are formed of metallic materials. For example, a stacked layer body including a titanium (Ti)-based layer and an aluminum (Al)-based layer can be applied as the metallic materials. The first electrode 14, the X line WX1, and the Y line WY may be formed of the same materials. The elastic members EM1 and EM2 are formed of, for example, resin having a modulus of elasticity (Young's modulus) less than that of the insulating base 10.

The cross-sectional structure shown in FIG. 7 can be applied to the cross-sectional structure including the X lines WX2 and the Y lines WY in the second portion 10B.

Another configuration example will be described next.

Figure 8:
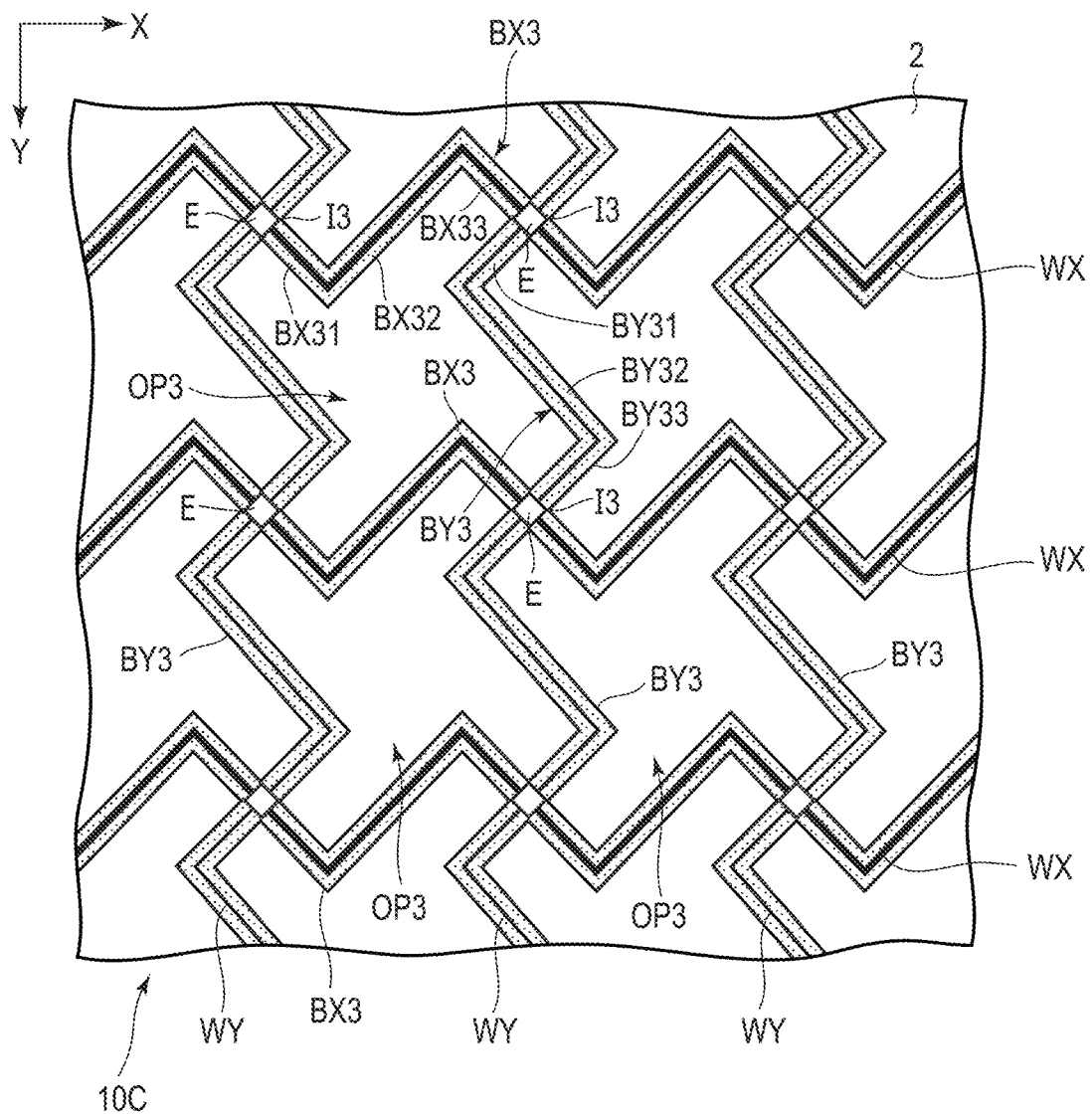
FIG. 8 is a plan view showing another configuration example of the insulating base 10 constituting the flexible substrate 2.

FIG. 8 is a plan view showing another configuration example of the insulating base 10 constituting the flexible substrate 2. FIG. 8 shows a third portion 10C corresponding to part of the insulating base 10. The third portion 10C may replace the first portion 10A shown in FIG. 2, etc., or may replace the second portion 10B, or may be added to in addition to the first portion 10A and the second portion 10B.

The third portion 10C comprises strip portions BX3 formed substantially along the first direction X, strip portions BY3 formed substantially along the second direction Y, and island-like portions 13. The strip portions BX3 are arranged in the second direction Y, and the strip portions BY3 are arranged in the first direction X. Each of the strip portions BX3 and BY3 is stretchable. For example, the strip portions BX3 and BY3 meander. The island-like portion 13 corresponds to the intersection of the strip portion BX3 and the strip portion BY3.

The island-like portions 13 are arrayed in a matrix in the first direction X and the second direction Y. The island-like portions 13 adjacent to each other in the first direction X are connected by the strip portions BX3, and the island-like portions 13 adjacent to each other in the second direction Y are connected by the strip portions BY3.

The strip portions BX3 each comprise straight portions BX31 to BX33. The straight portions BX31 to BX33 extend in directions different from the first direction X and the second direction Y. In addition, the straight portion BX32 extends in a direction different from those of the straight portions BX31 and BX33. That is, the straight portions BX31 and BX32 intersect each other, and the straight portions BX32 and BX33 intersect each other. The straight portions BX31 and BX33 connect the straight portion BX32 and the island-like portions 13, respectively.

The strip portions BY3 each comprise straight portions BY31 to BY33. The straight portions BY31 to BY33 extend in directions different from the first direction X and the second direction Y. In addition, the straight portion BY32 extends in a direction different from those of the straight portions BY31 and BY33. That is, the straight portions BY31 and BY32 intersect each other, and the straight portions BY32 and BY33 intersect each other. The straight portions BY31 and BY33 connect the straight portion BY32 and the island-like portions 13, respectively.

From another point of view, the third portion 10C comprises opening portions OP3 penetrating the insulating base 10. The opening portions OP3 are arrayed in a matrix. Each of the opening portions OP3 is formed into a polygonal shape (for example, a dodecagon) surrounded by two strip portions BX3 adjacent to each other in the second direction Y and two strip portions BY3 adjacent to each other in the first direction X. Each of the strip portions BY3 is located between two opening portions OP3 adjacent to each other in the first direction X, and each of the strip portions BX3 is located between two opening portions OP3 adjacent to each other in the second direction Y. The respective shapes of the opening portions OP3 are substantially identical. The shapes of the opening portions OP3 are not limited to the example shown in FIG. 8.

The X lines WX are disposed on the strip portions BX3, and meander in the same way as the strip portions BX3. The Y lines WY are disposed on the strip portions BY3, and meander in the same way as the strip portions BY3. The electrical element E is disposed on the island-like portion 13 and is electrically connected to the X line WX and the Y line WY.

In this manner, the third portion 10C of the insulating base 10 is constituted of the island-like portions 13 and the strip portions BX3 and BY3, so that the third portion 10C can have elasticity. That is, when tensile stress or compressive stress in a specific direction is applied to the third portion 10C, the strip portions BX3 and BY3 expand or contract in accordance with the tensile stress or compressive stress. The third portion 10C is thereby deformed into a shape according to the tensile stress or compressive stress.

Figure 9:
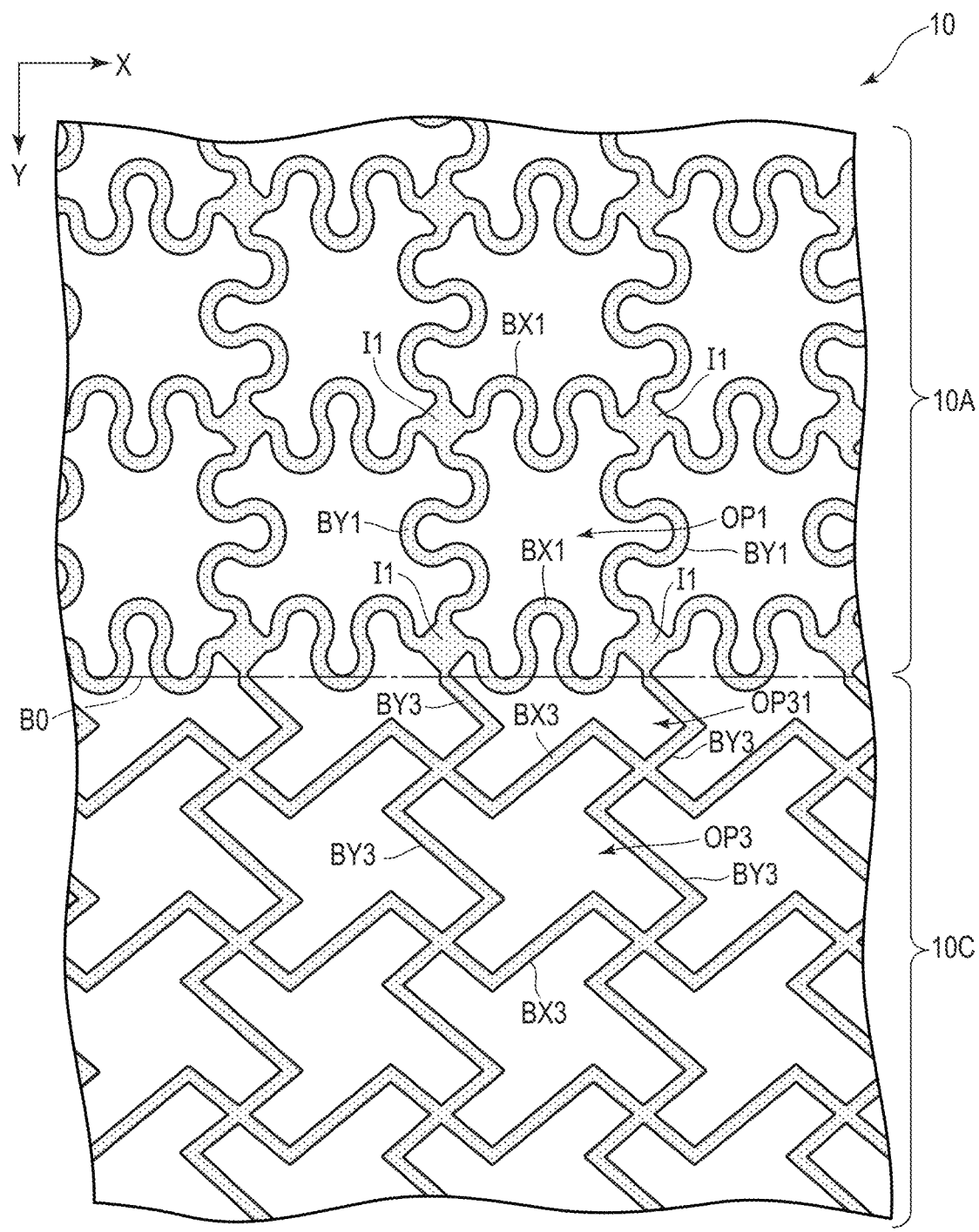
FIG. 9 is a schematic plan view of another insulating base 10 constituting the flexible substrate 2.

FIG. 9 is a schematic plan view of another insulating base 10 constituting the flexible substrate 2. In configuration example shown in FIG. 9, the second portion 10B of the configuration example shown in FIG. 2 is replaced by the third portion 10C shown in FIG. 8. That is, the insulating base 10 comprises the first portion 10A, which is stretchable, and the third portion 10C, which is adjacent to the first portion 10A and is stretchable. The first portion 10A and the third portion 10C are integrally formed. The elongation rate of the first portion 10A is different from that of the third portion 10C. For example, the elongation rate of the first portion 10A is higher than that of the third portion 10C.

The strip portions BX1 and BY1 in the first portion 10A and the strip portions BX3 and BY3 in the third portion 10C meander. The shapes of the strip portions BX1 are different from those of the strip portions BX3, and the shapes of the strip portions BY1 are different from those of the strip portions BY3. The strip portions BX1 and BY1 comprise curved portions as described above with reference to FIG. 3. In addition, the strip portions BX3 and BY3 comprise straight portions extending in different directions as described above with reference to FIG. 8.

The shapes of the opening portions OP1 in the first portion 10A are different from those of the opening portions OP3 in the third portion 10C.

For example, an island-like portion I1 of the first portion 10A and a strip portion BY3 of the third portion 10C are connected at the border B0 between the first portion 10A and the third portion 10C. Any one of the strip portions in the first portion 10A may be connected to any one of the strip portions in the third portion 10C.

In addition, the area including the border B0 comprises opening portions OP31 arranged in the first direction X. Each of the opening portions OP31 is surrounded by strip portions BX1 and BX3 adjacent to each other in the second direction Y and strip portions BY3 adjacent to each other in the first direction X. The shapes of the opening portions OP31 are different from both the shapes of the opening portions OP1 and the opening portions OP3.

This configuration example also can achieve the same advantages as those of the above-described configuration example.

Figure 10:
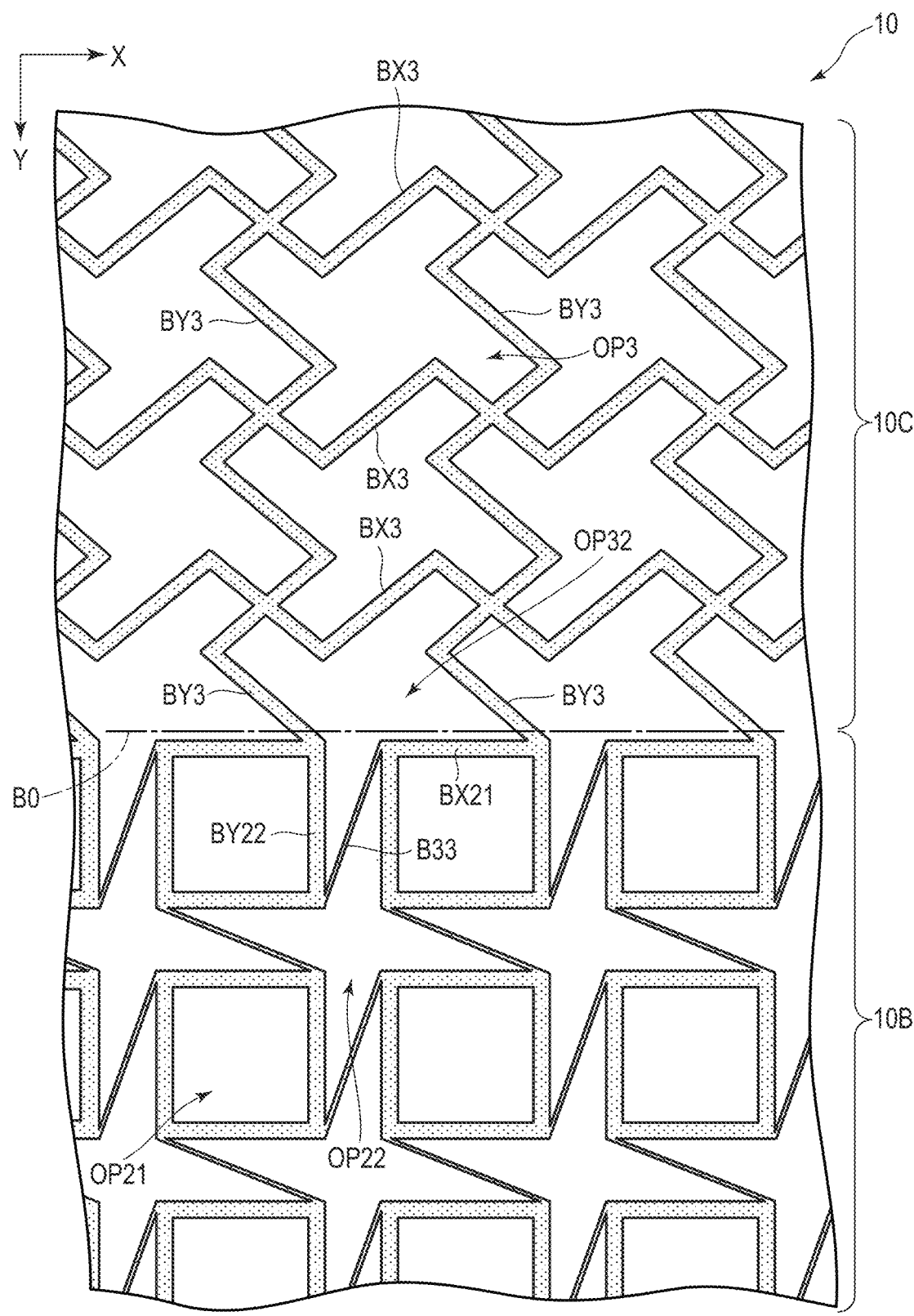
FIG. 10 is a schematic plan view of another insulating base 10 constituting the flexible substrate 2.

FIG. 10 is a schematic plan view of another insulating base 10 constituting the flexible substrate 2. In the configuration example shown in FIG. 10, the first portion 10A of the configuration example shown in FIG. 2 is replaced by the third portion 10C shown in FIG. 8. That is, the insulating base 10 comprises the third portion 10C, which is stretchable, and the second portion 10B, which is adjacent to the third portion 10C and is stretchable. The third portion 10C and the second portion 10B are integrally formed. The elongation rate of the third portion 10C is different from that of the second portion 10B. For example, the elongation rate of the third portion 10C is higher than that of the second portion 10B.

The shapes of the opening portions OP21 and OP22 in the second portion 10B and the shapes of the opening portions OP3 in the third portion 10C are different from each other.

For example, a strip portion BX21 of the second portion 10B and a strip portion BY3 of the third portion 10C are connected at the border B0 between the second portion 10B and the third portion 10C. Any one of the strip portions in the second portion 10B may be connected to any one of the strip portions in the third portion 10C.

In addition, the area including the border B0 comprises opening portions OP32 arranged in the first direction X. Each of the opening portions OP32 is surrounded by a strip portion BX21, a strip portion B33, a strip portion BY22, a strip portion BX3, and strip portions BY3 adjacent to each other in the first direction X. The shapes of the opening portions OP32 are different from all the shapes of the opening portions OP21, the opening portions OP22, and the opening portions OP3.

This configuration example also can achieve the same advantages as those of the above-described configuration example.

Figure 11:
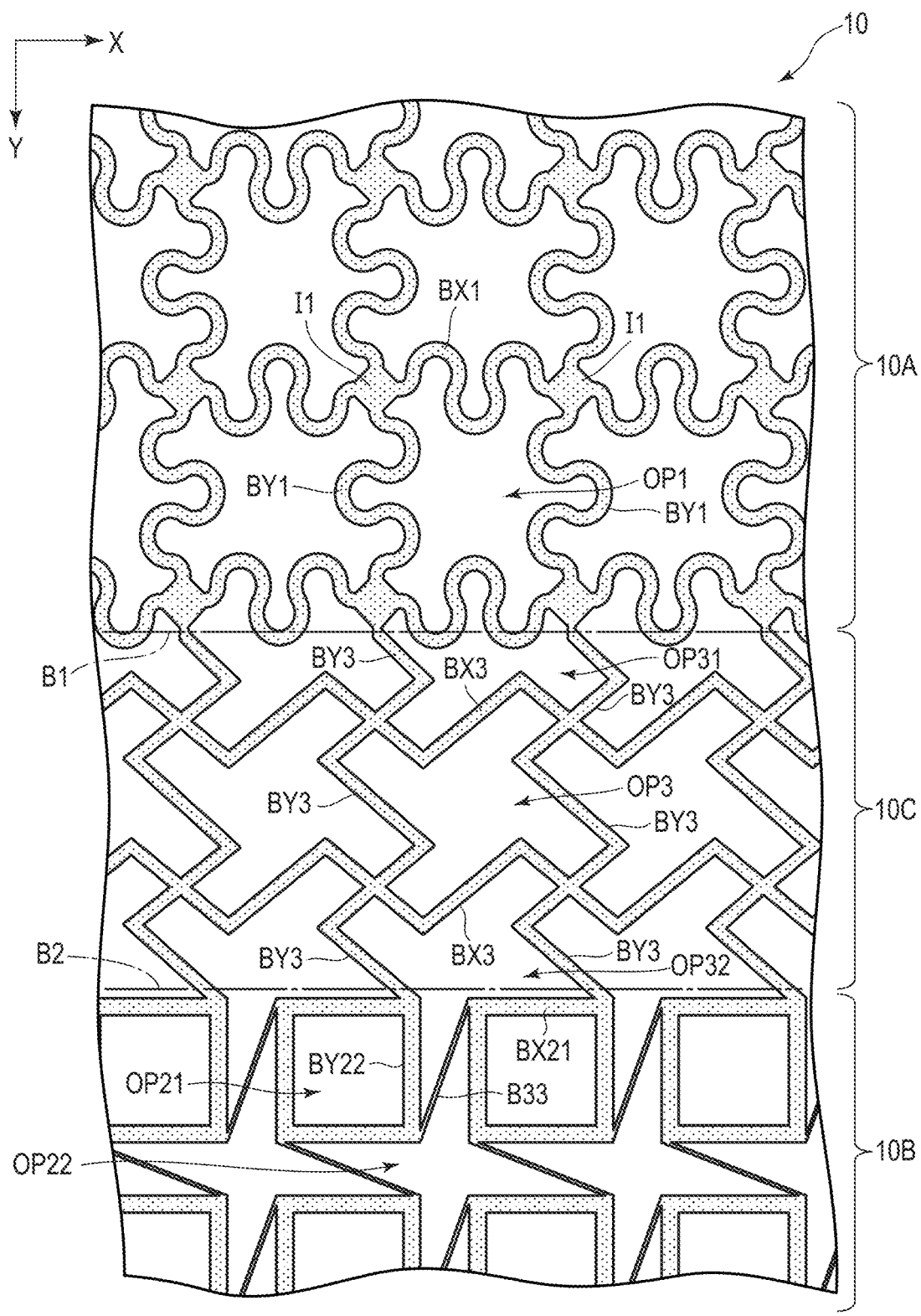
FIG. 11 is a schematic plan view of another insulating base 10 constituting the flexible substrate 2.

FIG. 11 is a schematic plan view of another insulating base 10 constituting the flexible substrate 2. In the configuration example shown in FIG. 11, the insulating base 10 comprises the first portion 10A, which is stretchable, the second portion 10B, which is stretchable, and the third portion 10C, which is located between the first portion 10A and the second portion 10B and is stretchable. The first portion 10A, the second portion 10B, and the third portion 10C are integrally formed. A first elongation rate of the first portion 10A, a second elongation rate of the second portion 10B, and a third elongation rate of the third portion 10C are different from each other. For example, the first elongation rate is higher than the third elongation rate, and the third elongation rate is higher than the second elongation rate. In addition, the difference between the second elongation rate and the third elongation rate is greater than the difference between the first elongation rate and the second elongation rate.

The strip portions BX1 and BY1 of the first portion 10A and the strip portions BX3 and BY3 of the third portion 10C meander. The strip portions BX21, BY22, B33, etc., of the second portion 10B are formed straight. The respective shapes of these strip portions are as described above.

For example, an island-like portion I1 of the first portion 10A and a strip portion BY3 of the third portion 10C are connected at a border B1 between the first portion 10A and the third portion 10C. For example, a strip portion BX21 of the second portion 10B and a strip portion BY3 of the third portion 10C are connected at a border B2 between the second portion 10B and the third portion 10C.

The shapes of the opening portions OP1 of the first portion 10A, the shapes of the opening portions OP3 of the third portion 10C, the shapes of the opening portions OP21 and OP22 of the second portion 10B, the shapes of the opening portions OP31 of the area including the border B1, and the shapes of the opening portions OP32 of the area including the border B2 are different from each other.

This configuration example also can achieve the same advantages as those of the above-described configuration example.

In FIG. 9 to FIG. 11, described above, the electrical elements, the X lines, the Y lines, etc., are omitted.

In the above-described examples, the cases where the insulating base 10 comprises portions having different planar shapes and the respective elongation rates of the portions are different have been described. However, the strip portions may comprise portions having different multilayered structures to adjust the respective elongation rates of the portions.

One of the techniques of adjusting the elongation rate of a strip portion B10 will be described hereinafter. Here, samples having a basic structure described below were prepared, and a tensile test was carried out to calculate their elongation rates.

Figure 12:
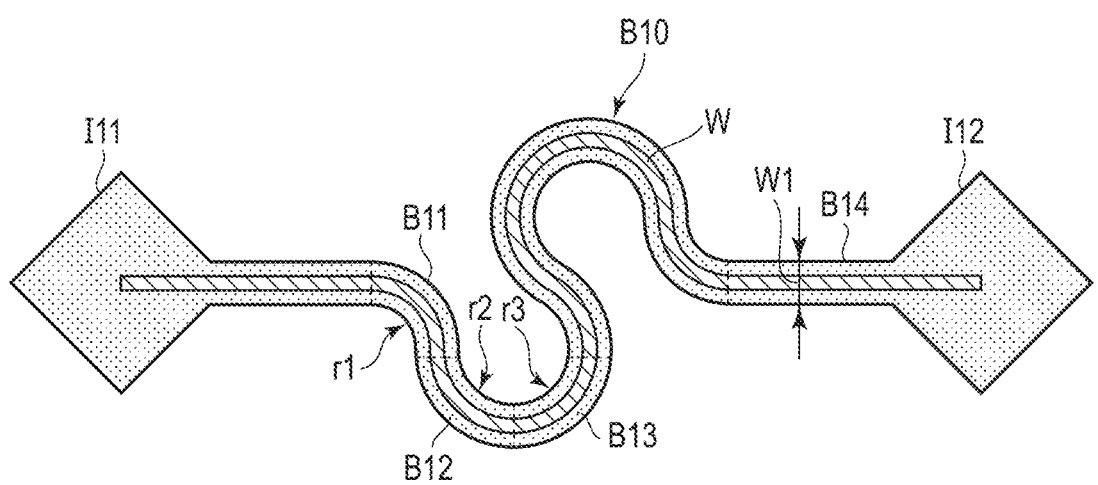
FIG. 12 is a diagram for explaining a basic structure of a strip portion B10.

FIG. 12 is a diagram for explaining the basic structure of the strip portion B10. The strip portion B10 connecting an island-like portion I11 and an island-like portion I12 meanders in an S-shape. A wiring line W is formed to extend over the island-like portion I11, the strip portion B10, and the island-like portion I12. The wiring line W formed on the strip portion B10 meanders in accordance with the shape of the strip portion B10. The strip portion B10 comprises curved portions B11 to B13 and a straight portion B14.

The radii of curvature along the respective inner peripheries of the curved portions B11 to B13 are denoted by r1 to r3, respectively. In addition, the line width of the straight portion B14 is denoted by W1.

Figure 13A:
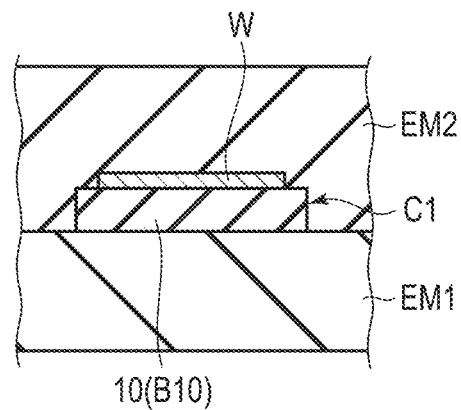
FIG. 13A is a cross-sectional view of a strip portion B10.
Figure 13B:
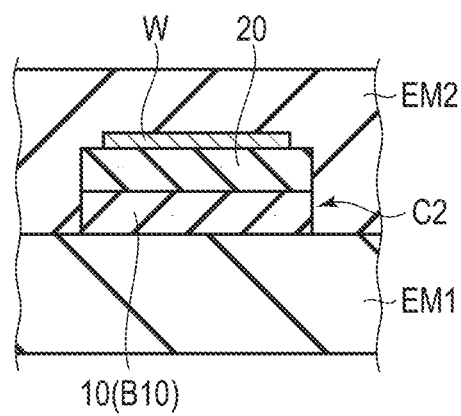
FIG. 13B is a cross-sectional view of the strip portion B10.

FIG. 13A and FIG. 13B are cross-sectional views of the strip portion B10. FIG. 13A shows a first structure C1 in which the wiring line W is formed on the strip portion B10, and FIG. 13B shows a second structure C2 in which an organic insulating layer 20 is interposed between the strip portion B10 and the wiring line W. The organic insulating layer 20 is formed of a material different from that of the insulating base 10, and for example, formed of an organic insulating material having a modulus of elasticity (Young's modulus) greater than that of the insulating base 10. The first structure C1 and the second structure C2 were subjected to the above tensile test to calculate their elongation rates and measure the resistance value of the wiring line W.

Figure 14:
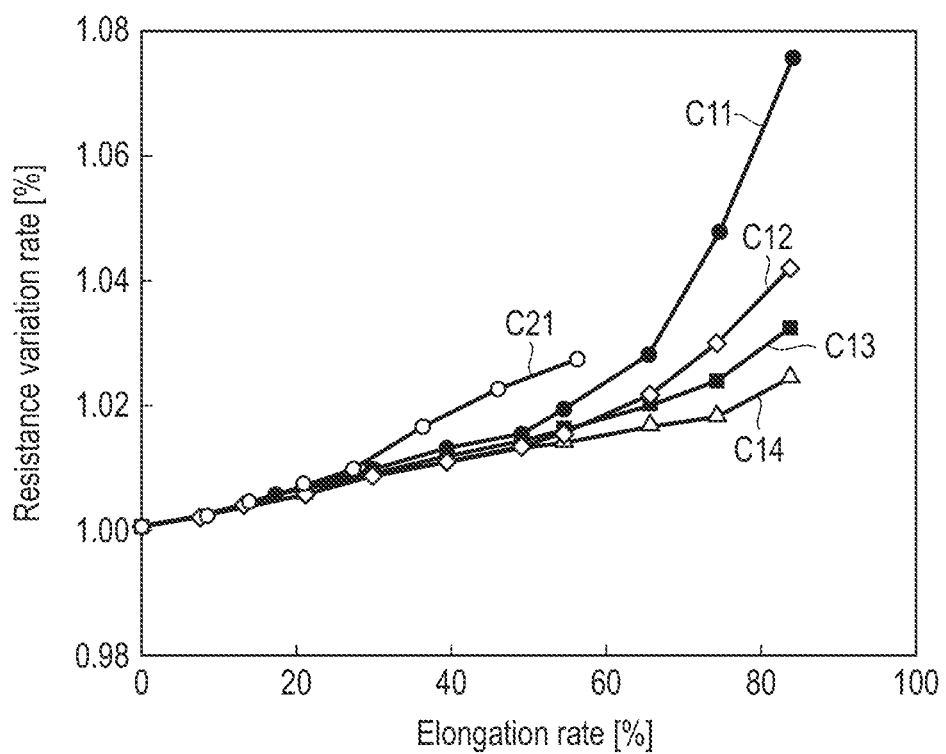
FIG. 14 is a diagram for explaining a relationship between elongation rates and resistance variation rates.

FIG. 14 is a diagram for explaining the relationship between elongation rates and resistance variation rates.

C11 to C14 in the figure represent measurement results in cases where the first structure C1 was applied. C11 represents the measurement result in the case where the radius of curvature R* was 30 µm and the width W1 was 15 µm. C12 represents the measurement result in the case where the radius of curvature R* was 37.5 µm and the width W1 was 25 µm. C13 represents the measurement result in the case where the radius of curvature R* was 37.5 µm and the width W1 was 20 µm. C14 represents the measurement result in the case where the radius of curvature R* was 37.5 µm and the width W1 was 15 µm.

C21 in the figure represents the measurement result in the case the second structure C2 was applied. C21 represents the measurement result in the case where the radius of curvature R* was 37.5 µm and the width W1 was 25 µm.

The radii of curvature R* herein mean that r1=r2=r3.

It has been confirmed that in the cases where the first structure C1 was applied, an increase of the resistance values of the wiring line W was suppressed even if the elongation rates increased, compared to that in the case where the second structure C2 was applied. In other words, when the elongation rates at equal resistance variation rates were compared, in the cases where the first structure C1 was applied, high elongation rates were obtained compared to that in the case where the second structure C2 was applied. From this fact, it has been confirmed that the first structure C1 has a higher degree of stretch than that of the second structure C2.

From the above results, it has been confirmed that the elongation rate of the strip portion B10 can be adjusted by the cross-sectional structure of the strip portion B10.

Figure 15B:
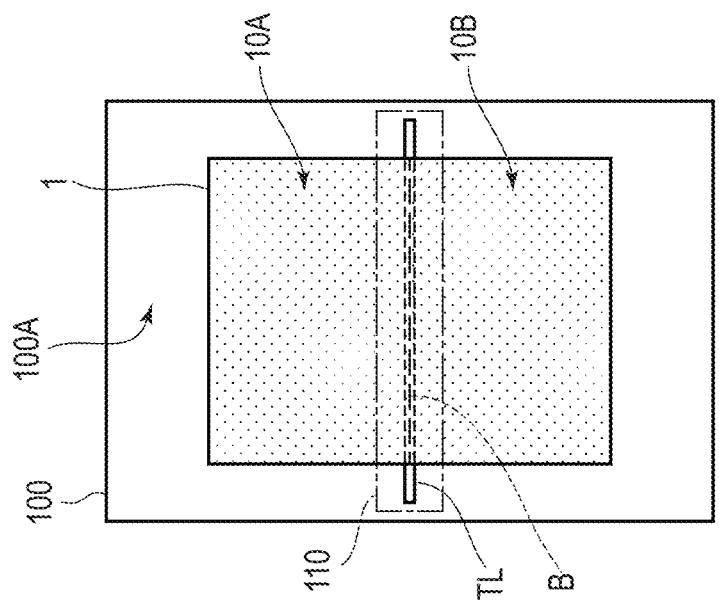
FIG. 15B is a diagram showing another application example of the electronic device 1.
Figure 15A:
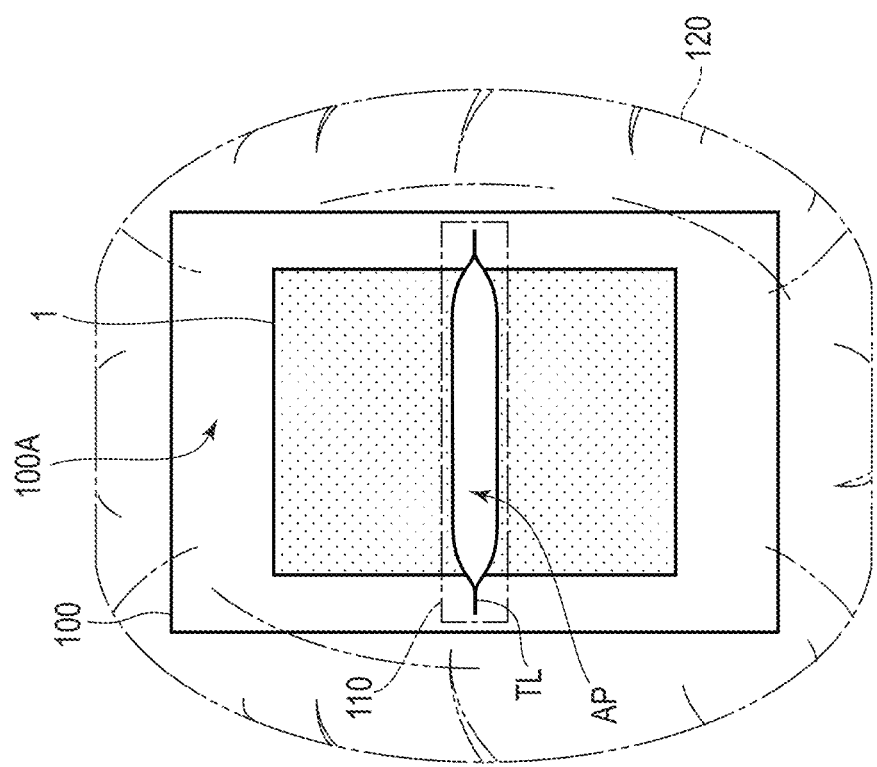
FIG. 15A is a diagram showing another application example of the electronic device 1.

FIG. 15A and FIG. 15B are diagrams showing another application example of the electronic device 1 of the present embodiment. An object 100 contains, for example, an airbag device 110 which is activated in case of an emergency such as collision. The airbag device 110, indicated by a long dashed short dashed line, comprises an airbag which inflates and deploys to protect a user in case of an emergency. FIG. 15A shows the state of the airbag device 110 before it is activated, and FIG. 15B shows the state of the airbag device 110 after it is activated.

As shown in FIG. 15A, a linear portion TL formed on a surface 100A of the object 100 guides the object 100 to cleave when the airbag inflates and deploys, and is referred to as a tear line in some cases. The linear portion TL is a thinly formed portion in part.

The electronic device 1 is attached to the surface 100A. If the insulating base 10 of the electronic device 1 is, for example, configured as shown in FIG. 2, a border B between the first portion 10A and the second portion 10B overlaps the linear portion TL.

As shown in FIG. 15B, when the airbag device 110 is activated, an airbag 120 accommodated in the airbag device 110 is filled with gas and thereby inflates and deploys. The object 100 cleaves by pressing force of the airbag 120, which has inflated and deployed, and forms an aperture AP in the linear portion TL. In addition, the electronic device 1 is broken at the border with the cleavage of the object 100. The airbag 120 indicated by dotted lines thereby springs out of the object 100 and further inflates and deploys, suppressing the collision of the user with the object 100.

In this manner, in a state where the electronic device 1 is attached to the object 100, the insulating base 10 of the electronic device 1 is broken with the cleavage of the object 100. Thus, the airbag 120 accommodated in the object 100 is not inhibited from inflating and deploying, and the user can be protected.

As described above, the present embodiment can provide an electronic device configured to have partially different elasticity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
an insulating base comprising a first portion which is stretchable and a second portion which is adjacent to the first portion and is stretchable, the first portion and the second portion being integrally formed; and
electrical elements disposed in the first portion and the second portion, respectively,
wherein a first elongation rate of the first portion is different from a second elongation rate of the second portion,
the first portion and the second portion are each formed into a mesh shape,
the insulating base comprises first opening portions located in the first portion and second opening portions located in the second portion, and
the shapes of the first opening portions are different from the shapes of the second opening portions.

2. The electronic device of claim 1, wherein
the insulating base comprises a first strip portion located between adjacent first opening portions and a second strip portion located between adjacent second opening portions, and
the shape of the first strip portion is different from the shape of the second strip portion.

3. The electronic device of claim 2, wherein
the first strip portion meanders and the second strip portion is formed straight.

4. The electronic device of claim 2, wherein
the first strip portion and the second strip portion each meander,
the first strip portion comprises a curved portion, and
the second strip portion comprises straight portions extending in directions different from each other.

5. An electronic device comprising:
an insulating base comprising a first portion which is stretchable and a second portion which is adjacent to the first portion and is stretchable, the first portion and the second portion being integrally formed; and
electrical elements disposed in the first portion and the second portion, respectively,
wherein a first elongation rate of the first portion is different from a second elongation rate of the second portion, and
the first elongation rate and the second elongation rate are different by 20% or more.

6. An electronic device comprising:
an insulating base comprising a first portion which is stretchable and a second portion which is adjacent to the first portion and is stretchable, the first portion and the second portion being integrally formed; and
electrical elements disposed in the first portion and the second portion, respectively,
wherein a first elongation rate of the first portion is different from a second elongation rate of the second portion, and
a border between the first portion and the second portion overlaps a linear portion which guides an object to cleave.

7. An electronic device comprising:
an insulating base comprising a first portion which is stretchable and a second portion which is adjacent to the first portion and is stretchable, the first portion and the second portion being integrally formed; and
electrical elements disposed in the first portion and the second portion, respectively, wherein
the insulating base comprises a first strip portion located between adjacent first opening portions in the first portion and a second strip portion located between adjacent second opening portions in the second portion, and
the shape of the first strip portion is different from the shape of the second strip portion.

8. The electronic device of claim 7, wherein
the electrical elements are light-emitting elements or sensors.

9. An electronic device comprising:
an insulating base comprising a first portion which is stretchable and a second portion which is adjacent to the first portion and is stretchable, the first portion and the second portion being integrally formed; and
electrical elements disposed in the first portion and the second portion, respectively,
wherein a first elongation rate of the first portion is different from a second elongation rate of the second portion, and
the electrical elements are light-emitting elements or sensors.

* * * * *